(12) United States Patent
Ganciu-Petcu et al.

(10) Patent No.: US 7,927,466 B2
(45) Date of Patent: Apr. 19, 2011

(54) PULSED MAGNETRON SPUTTERING DEPOSITION WITH PREIONIZATION

(75) Inventors: Mihai Ganciu-Petcu, Bucharest (RO); Michel Hecq, Mons (BE); Jean-Pierre Dauchot, Brussels (BE); Stephanos Konstantinidis, Blaton (BE); Jean Bretagne, Limours (FR); Ludovic De Poucques, La ville du bois (FR); Michel Touzeau, Grenoble (FR)

(73) Assignees: Material Nova ASBL (BE); Centre National De La Recherche Scientifique (CNRS) (FR); Universite Paris-Sud (FR)

( * ) Notice: Subject to any disclaimer, the term of this patent is extended or adjusted under 35 U.S.C. 154(b) by 760 days.

(21) Appl. No.: 11/525,368

(22) Filed: Sep. 22, 2006

(65) Prior Publication Data
US 2007/0034498 A1 Feb. 15, 2007

Related U.S. Application Data

(63) Continuation of application No. PCT/BE2005/00038, filed on Mar. 22, 2005.

(30) Foreign Application Priority Data

Mar. 22, 2004 (EP) .................................... 04447072

(51) Int. Cl.
*C23C 14/00* (2006.01)
*C23C 14/32* (2006.01)
*C25B 9/00* (2006.01)
*C25B 11/00* (2006.01)
*C25B 13/00* (2006.01)

(52) U.S. Cl. .......... 204/192.12; 204/298.02; 204/298.08

(58) Field of Classification Search ............. 204/192.12, 204/298.02, 298.08
See application file for complete search history.

(56) References Cited

U.S. PATENT DOCUMENTS 6,662,793 B1 * 12/2003 Allen et al. .................... 123/620
2005/0092596 A1 * 5/2005 Kouznetsov ............. 204/192.12

FOREIGN PATENT DOCUMENTS

WO WO 02/103078 12/2002
WO WO 03/079397 9/2003

OTHER PUBLICATIONS

International Preliminary Report on Patentability (translation), International Application No. PCT/BE2005/000038, date of actual completion of the corresponding international search Jul. 6, 2005, date of actual mailing of the corresponding international search report Jul. 14, 2005, 6 pages, European Patent Office.

* cited by examiner

*Primary Examiner* — Alexa D Neckel
*Assistant Examiner* — Michael Band
(74) *Attorney, Agent, or Firm* — Reinhart Boerner Van Deuren P.C.

(57) ABSTRACT

The present invention relates to the deposition in a magnetron reactor (1) equipped with a magnetron cathode (MC) of at least one material on a substrate (11a), according to which process said material is vaporized by magnetron sputtering, using a gas that is ionized in pulsed mode. To this effect and in order to favour the formation of high current pulses of short duration while avoiding the formation of electric arcs and while enabling an effective ionisation of the sputtered vapour, a preionization of the said gas prior to the application of the main voltage pulse on the magnetron cathode (MC) is carried out in order to generate current pulses (CP) whose decay time $(T_d)$, after cut-off of the main voltage pulse (VP) is shorter than 5 μs.

17 Claims, 18 Drawing Sheets

PULSED MAGNETRON SPUTTERING DEPOSITION WITH PREIONIZATION

CROSS-REFERENCE TO RELATED PATENT APPLICATIONS

This patent application is a continuation of International Patent Application No. PCT/BE2005/00038 filed, Mar. 22, 2005, which claims priority to European Patent Application No. 04447072.2 filed, Mar. 22, 2004, the teachings and disclosure of which are hereby incorporated in their entireties by reference thereto.

SUBJECT OF THE INVENTION

The present invention relates in general to the deposition on a substrate of a material vaporized by magnetron sputtering. The subjects of the invention are a novel process for depositing at least one material on a substrate by pulsed magnetron sputtering, and a novel pulsed power supply for the magnetron, and a magnetron equipped with said pulsed power supply.

PRIOR ART

The technique of depositing material on a substrate by magnetron sputtering is known and has rapidly developed since the 1970s.

This deposition technique and its main improvements known to date have for example been described in the article: "*Magnetron sputtering: a review of recent developments and applications*" by P. J. Kelly, and R. D. Arnell, VACUUM 56(2000) pages 159-172.

In short, the technique of depositing a material on a substrate by magnetron sputtering consists in general in bombarding a target, which forms the cathode of a magnetron reactor and is made of a material to be deposited, with ions emanating from an electrical discharge (plasma). This ion bombardment causes the target to be sputtered in the form of a "vapor" of atoms or molecules that are deposited, in the form of a thin film, on the substrate placed near the target of the magnetron, it being possible for the substrate to be stationary or moving.

In nonreactive mode, the gas intended to form the plasma is an inert gas, for example argon. In what is called "reactive" mode, a gas, generally diluted in an inert gas, is used to generate a compound which, depending on the case, may or may not be electrically conducting. With a titanium cathode target, an argon/nitrogen mixture is used for example as the reactive gas, resulting in the formation of a titanium nitride (TiN) compound, which is electrically conducting, or an argon/oxygen mixture is used, resulting in the formation of a titanium dioxide ($TiO_2$) compound, which is electrically insulating.

Whatever the gas used, the atoms are ionized essentially by collisions with the electrons produced in the electrical discharge. Near the target, a magnetic field is also created, which traps the electrons formed in the gas, thus forming a more highly ionized plasma near the surface of the target.

Magnetron sputtering processes are carried out at low pressure (typically between 0.1 Pa and a few Pa). As a result, the ions undergo no or few collisions during their path toward the cathode target, thereby increasing the effectiveness of the sputtering. This low pressure also makes it easier to transport sputtered material to the substrate, by reducing the number of collisions between the sputtered atoms or molecules, and consequently reducing the magnitude of deviation processes and/or loss of kinetic energy of the sputtered particles (atoms or molecules).

The aforementioned technique of depositing material on a substrate by magnetron sputtering is particularly suitable for depositing, essentially as thin films, a wide variety of materials in very varied fields of application such as microelectronics (deposition of metals for interconnection and of dielectrics for MOSFET structures), optoelectronics (fabrication of piezoelectric substrates), mechanical engineering or connector technology (deposition of wear-resistant coatings, anticorrosion coatings, etc.) and the glass industry (functional layers). The materials deposited may be electrically conducting metallic materials or compounds, insulating ceramics of the type comprising nitrides, oxides, carbides, oxynitrides, etc.

Compared with other known deposition techniques involving evaporation (the thermal evaporation and deposition process, especially using inductive heating, or the electron-beam or arc evaporation deposition process), magnetron sputtering has the advantage of being more directional, because of the existence of a relatively open emission lobe perpendicular to the cathode target, with sputtered particle ejection velocities that may advantageously be higher.

Originally, in the aforementioned technique of magnetron sputtering deposition, the electrical discharges in the plasma were generated in steady-state mode by applying a DC voltage to the cathode or by radiofrequency (RF) excitation of the gas.

In general, the limitations of the magnetron sputtering technique in steady-state mode are due to the generally insufficient quality of the films deposited, particularly as regards porosity, and to the difficulty of obtaining uniform deposition on substrates having a deposition surface of complex geometry, and to deposition rates that remain relatively low (typically of the order of 1 μm/h). More particularly, with regard to the quality of the films deposited, it is often observed in steady-state (DC or RF) mode that electric arcs are inopportunely formed, which cause material to be ejected from the target in the form of droplets, which are deposited on the substrate, prejudicially creating defects in the coating.

In addition, in the case of the deposition of insulating materials by magnetron sputtering, the use of RF excitation alone remains relatively complex and it is difficult to control the process. Furthermore, the sputtering rates are considerably reduced.

To improve the deposition of insulating materials by magnetron sputtering, particularly oxides such as alumina, it has already been proposed to pulse the magnetron discharge (see the aforementioned article by P. J. Kelly and R. D. Arnell, pages 166 to 168/section 7 entitled "*Pulsed magnetron sputtering*"). Thus, according to this technique in pulsed mode, voltage pulses are applied to the magnetron cathode for the purpose of creating, in the plasma gas, a pulsed discharge current (current pulses) for ionizing the gas and forming a highly ionized plasma (hereafter referred to as the "main" plasma).

In particular, in this article it is indicated that, by pulsing the magnetron discharge at frequencies above 20 kHz, and in particular in the frequency range 20 kHz-100 kHz, it would be possible to avoid the formation of electric arcs caused by target poisoning by an insulating layer. The deposition rates are also improved (of the order of some 10 μm/h).

This article also states that the duration of the "on" pulse must be limited (adapted) in order to limit the surface charge due to the target poisoning which is the cause of the electric arcs, and that, during the "off" pulse the surface electric charge is neutralized.

More particularly, it is specified that the most effective suppression of the electric arcs is observed when the duration of the "off" pulses approaches or is equal to the duration of the "on" pulses. In the illustrative example given (in FIG. 12), the duration of the "off" pulses represents about 10% of the total cycle time, and is equal to 5 µs, the duration of the "on" pulses being 45 µs. Under these conditions, the mean current is only slightly less (by 10%) than the pulse current.

More recently, it has been proposed for example in U.S. Pat. No. 6,296,742 (Kousnetsov), to improve the magnetron sputtering deposition technique in pulsed mode allowing effective ionization of the sputtered vapor, by using pulses having a very high instantaneous power (0.1 kW-1 MW) that are generated in such a way that the gas (plasma) located near the cathode rapidly reaches a high state of ionization (S8 operating range in FIG. 1 of U.S. Pat. No. 6,296,742).

It is explained in U.S. Pat. No. 6,296,742 that this solution would allow a high voltage to be applied to the cathode while still preventing electric arc formation. In practice, it is found that the implementation of this solution is accompanied by the formation of electric arcs prejudicial to the quality of the deposited films. Such inopportune electric arc formation may be explained by the fact that the gas, before reaching a high state of ionization, must pass through an arc discharge region (region S7 of FIG. 1 of U.S. Pat. No. 6,296,742). However, the Applicants are not tied to this explanation.

With the pulsed magnetron sputtering deposition technique, if it is desired to increase the instantaneous power of the electrical discharges produced in the gas, it is necessary to apply voltage pulses to the cathode that are as short as possible (typically lasting less than 50 µs, more particularly less than 20 µs and preferably less than 5 µs). This is because it has been found that by reducing the duration of the voltage pulses, the risks of inopportune electric arc formation are reduced.

However, the inventors have demonstrated that reducing the duration of the voltage pulses applied to the cathode results in two drawbacks prejudicial to the formation of the current pulses in the gas. These two drawbacks are associated with the delay time in forming the current pulse with respect to the voltage pulse, that is to say the time that elapses between application of the voltage pulse to the magnetron cathode and the start of formation of the current pulse in the gas. This delay time is due to the time required for the electron avalanche to develop.

$1^{st}$ Drawback: Excessively Long Delay Time

In the worst case, it turns out that the aforementioned delay time is longer than the duration of the voltage pulse. In this case, the common pulse does not form. If this delay time is shorter than the voltage pulse, but is such that the current pulse does not have the time to develop correctly before the end of the voltage pulse, the result is the formation of a current pulse of low amplitude, and consequently prejudicial to the formation of a low-power electrical discharge. In short, the longer the delay time relative to the duration of the voltage pulse, the lower the amplitude of the current pulse (which is even practically zero should the delay time be longer than the duration of the voltage pulse).

$2^{nd}$ Drawback: Fluctuation in the Delay Time

The second drawback is a substantial fluctuation in the delay time, resulting in instability and poor reproducibility over time of the current pulses being formed. This drawback makes the deposition process random and nonreproducible.

OBJECTS OF THE INVENTION

The present invention aims to improve the known processes for depositing a material by pulsed magnetron sputtering, by providing a novel solution that makes it possible in particular to alleviate the aforementioned drawbacks, while still ensuring effective ionization of the sputtered vapor.

More particularly, the object of the invention is to propose a process for depositing a material by pulsed magnetron sputtering that makes it possible to generate electrical discharges, preferably of high power, with good stability and good reproducibility over time, while still reducing the risk of electric arc formation and by reducing the risk of redeposition of the sputtered material on the cathode.

SUMMARY OF THE INVENTION

The aforementioned objectives are achieved by the process of claim 1. This process is known in that at least one material is deposited, in a magnetron reactor equipped with a magnetron cathode, on a substrate by vaporizing said material by magnetron sputtering and using a gas that is ionized (main plasma) in pulsed mode by applying main voltage pulses to the magnetron cathode.

The invention is characterized in that, prior to each main voltage pulse, said gas is preionized so as to generate current pulses whose decay time, after cut-off of the main voltage pulse, is shorter than 5 µs and preferably shorter than 1 µs.

Prior to the invention, it has already been proposed, in international patent application WO 02/103078, a process for generating pulse plasma in a magnetron reactor with a prior preionization regime by means of a DC current before the voltage pulse.

However, firstly this international patent application WO 02/103078 does not deal with the problem of stability and reproducibility over time of the current pulses generated.

Secondly, the power supply used in international patent application WO 02/103078 (see FIG. 9) employs a circuit comprising inductors (L1, L2) in series with the magnetron cathode and allowing the discharge currents to be limited (page 22, line 2) more particularly, according to the teaching of thus publication (page 22, lines 2 and 3), the inductance of the inductor (L1) must be as high as necessary to produce the preionization current. However, the use of this inductor (L1) in series is prejudicial to the current pulse. This is because it introduces a time constant, which prejudicially increases the cut-off time of the current pulse (that is to say the decay time of the current pulse after cut-off of the voltage pulse). In practice, with this type of power supply, the cut-off time of the current pulse is long and greater than 10 µs. Thus, and unlike the invention, with the technical solution described in international patent application WO 02/103078 it is not conceivable to obtain very short cut-off times for the current pulse, that is to say cut-off times shorter than 5 µs and preferably shorter than 1 µs.

Now, the inventors have been able to demonstrate that it is of paramount importance, in order to obtain optimum conditions for depositing the sputtered material on the substrate, to generate current pulses with a very short cut-off time. Specifically, it has been shown that with long cut-off times (>10 µs), such as those obtained for example with the technical solution described in international patent application WO02/103078, the risks of the sputtered material being redeposited on the cathode, which are associated with self-sputtering, are increased, thereby reducing the rate of deposition on the substrate. Thanks to the invention, it is therefore advantageously possible to very substantially reduce, if not prevent, the phenomena of redeposition on the cathode that are associated with self-sputtering.

The gas preionization according to the invention before each main voltage pulse also results in the creation, in the magnetron reactor, of an initial plasma which advantageously reduces the delay time of the current pulse with respect to the main voltage pulse and to make this delay time less fluctuating. Compared with a process without preionization, pulsed electrical discharges of higher instantaneous power are thus generated and with a mean power that is relatively constant over time. Thus, thanks to the process of the invention, the formation of the current pulse is favored (stabilized and/or accelerated).

This preionization is particularly advantageous in pulsed operating mode with short main voltage pulses which furthermore advantageously makes it possible to reduce the probability of inopportune electric arc formation.

Another role of the preionization is to create, in the magnetron, between the cathode and the substrate, a sufficient free-electron density that favors the transport of the vapor of ionized material toward the substrate.

Another important advantage of the process of the invention is the high state of ionization of the vapor arriving on the substrate. Thanks to the preionization, a degree of ionization of the vapor arriving on the substrate of greater than 10%, and preferably greater than 70%, is obtained. This degree of ionization is measured near the substrate by an absorption spectroscopy method of the type described in either of the following two publications:

S. Konstantinidis, A. Ricard, M. Ganciu, J.-P. Dauchot, M. Wautelet, and M. Hecq, "*A study of an ionized magnetron source by pulsed absorption* spectroscopy", Proceedings of the 46$^{th}$ Annual Technical Conference of the Society of Vacuum Coaters, published by the Society of Vacuum Coaters, Albuquerque, N. Mex., USA (2003), 452; and O. Leroy, L. de Poucques, C. Boisse-Laporte, M. Ganciu, L. Teule-Gay and M. Touzeau "*Determination of titanium temperature and density in a magnetron vapor sputtering device assisted by two microwave coaxial excitation systems*" J. of Vacuum Science & Technology A: Vacuum, Surfaces, and Films, 22 (2004), 192.

Thanks to the invention, by obtaining a high degree of ionization of the vapor arriving on the substrate it is advantageously possible to improve the quality of the films deposited on the substrate (especially better adhesion and better compactness of the films deposited).

Another advantage of carrying out a preionization according to the invention is that the surface of the substrate is conditioned (predeposition, ablation, polarization) that allows the properties of the deposited films (adhesion, structure, uniformity) to be modulated according to the envisaged applications. This advantage is for example particularly beneficial in the field of microelectronics.

According to the invention, the gas may be preionized before each main voltage pulse in several different ways.

According to a first method of implementation, the gas is preionized by applying a preionization voltage to the magnetron cathode. This preionization voltage is preferably a DC voltage, but it may also be a pulsed voltage, the essential point being that the preionization of the gas (formation of the initial plasma) is effective before the main voltage pulse is applied in order to form the main plasma.

In a second method of implementation, the gas is preionized by RF excitation of the gas.

In a third method of implementation, the gas is preionized by microwave excitation of the gas or by any other means for generating a sufficient density of free charges in the space lying between the cathode and the anode. For example, in the case of the magnetized region facing the cathode, this density (estimated using the relationship between electron density and the density of the ion current extracted from the plasma) is preferably greater than $10^8$ cm$^{-3}$ and more preferably still greater than $10^9$ cm$^{-3}$.

In a fourth method of implementation, the preionization may be ensured by a pulse repetition frequency high enough to form a stable current pulse at each voltage pulse, so as to use the residual electron density between two successive pulses.

Within the context of the invention, the main voltage pulses for forming the main plasma may be applied to the magnetron cathode in single-pulse mode or in multiple-pulse mode, that is to say pulses being generated in successive trains of at least two closely spaced pulses.

Preferably, whatever the method of implementing the gas preionization and whatever the pulse mode (single-pulse or multiple-pulse), the duration of the main voltage pulses is shorter than 50 µs, more particularly shorter than 20 µs, and preferably between 1 µs and 10 µs. More particularly, the frequency of the pulses (in single-pulse mode), or of the closely-spaced pulse trains does not exceed 100 kHz and is preferably greater than 50 Hz.

Other subjects of the invention are a novel pulsed power supply for a magnetron reactor according to claim 13 and a magnetron reactor equipped with this pulsed power supply.

BRIEF DESCRIPTION OF THE DRAWINGS

Other features and advantages of the invention will become more clearly apparent on reading the following description of various methods of implementing the process of the invention, which description is given by way of nonexhaustive and nonlimiting example of the invention, and with reference to the appended figures in which.

DETAILED DESCRIPTION OF THE INVENTION

Figure 1:
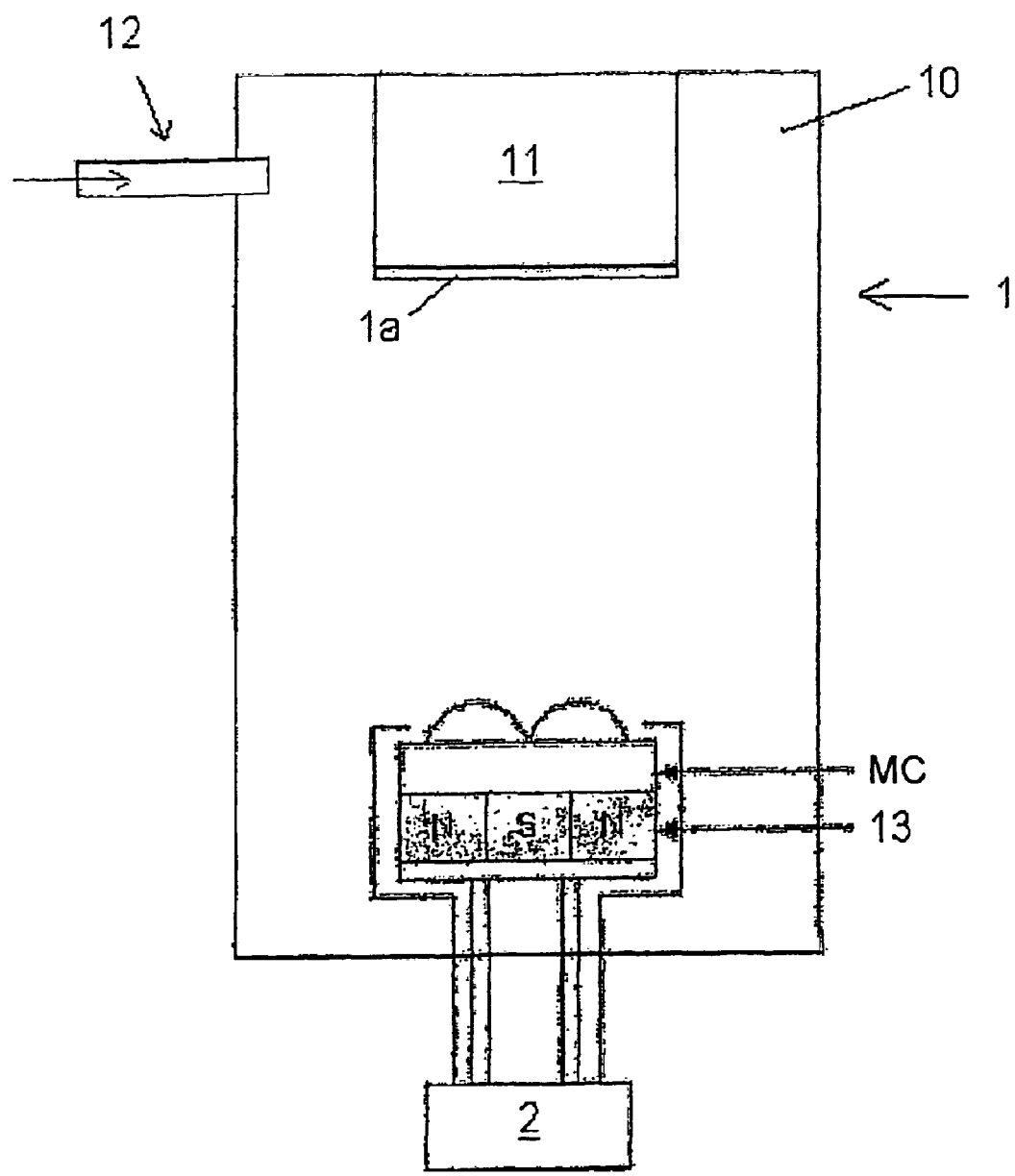
FIG. 1 shows schematically a magnetron reactor equipped with a pulsed power supply of the invention.

Basic diagram of the magnetron reactor (1) of FIG. 1

FIG. 1 shows the basic diagram of a magnetron reactor 1 equipped with a pulsed power supply 2 according to the invention.

The magnetron reactor 1 is known per se. Its structure and its general operation will be briefly recalled.

The magnetron reactor 1 essentially comprises, and in a manner known per se, a deposition chamber 10 inside which a cathode, hereafter called the magnetron cathode, MC is mounted. A substrate holder 11 designed to house a substrate 11a is mounted facing and at some distance from this magnetron cathode MC. The chamber 10 is also equipped with an intake system 12 for introducing a gas or gas mixture, which, once ionized, will form a plasma. The magnetron cathode is formed by a specimen of the material that it is desired to deposit in thin-film form on the substrate 11a.

In general, and in a manner known per se, the power supply 2 makes it possible in operation to apply a negative voltage to the magnetron cathode MC, which generates electrical discharges within the gas inside the deposition chamber 10, resulting in the formation of a discharge current passing through the magnetron cathode MC and in a high degree of ionization of the gas (formation of the main plasma). The ions of this main plasma bombard the surface (target) of the magnetron cathode MC with velocities high enough to surface sputter the magnetron cathode MC. Thus, a vapor of the constituent material of the cathode MC forms within the chamber 10, which vapor is deposited as a thin film on the surface of the substrate 11a.

Also provided, level with the lower face of the cathode MC, are magnets 13 which create a permanent magnetic field whose main function is to capture and confine the electrons of the main plasma in the vicinity of the magnetron cathode. This magnetic field thus makes it possible to form and maintain a magnetized plasma that is more highly ionized in the vicinity of the magnetron cathode MC.

Figure 2:
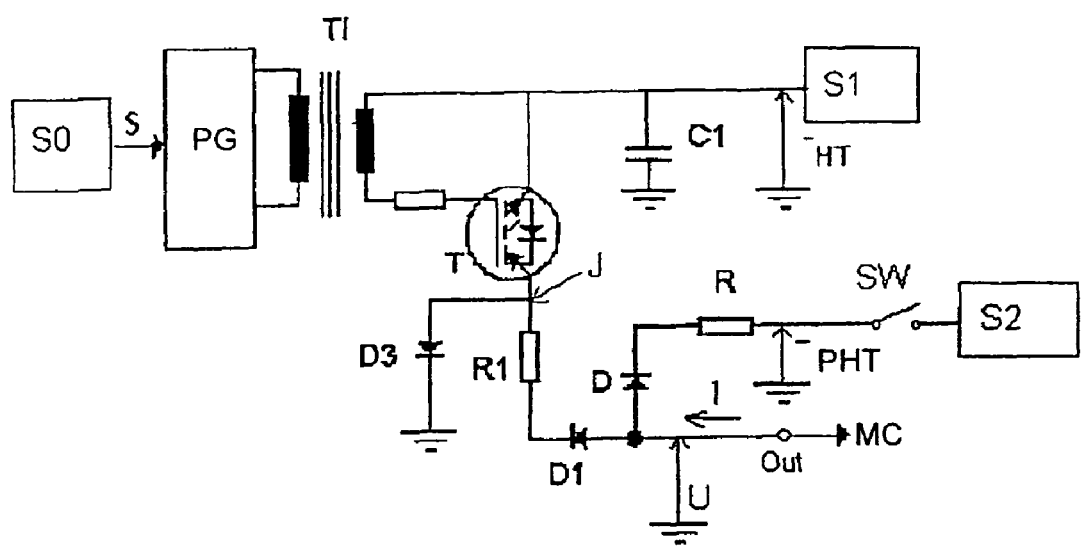
FIG. 2 is a circuit diagram of an exemplary embodiment of a pulsed power supply of the invention.

Structure of the Power Supply (2) of FIG. 2

FIG. 2 shows the circuit diagram of an exemplary embodiment of a pulsed power supply 2 according to the invention.

The power supply used in the invention is designed so as to have the advantages of continuous or pulsed preionization.

The power supply 2 comprises an output (Out) which is connected (in a manner known per se) to the cathode MC of the magnetron reactor, first means (S0, PG, PT, T, S1, C1, R1, D1, D3) for generating main voltage pulses on the output (Out) and second means (S2, R, D) for generating a preionization voltage on the output (Out) simultaneously with the main voltage pulses.

More particularly, in the example of the embodiment shown in FIG. 2, the first aforementioned means for generating the main voltage pulses comprise:

- a DC voltage source S1 (delivering a negative voltage HT as output);
- means (S0, G1, T1) for generating control pulses;
- switching means T which are mounted between the DC voltage source S1 and the output (Out); and
- a resistor R1 and a separating diode D1 which are connected in series between the switching means TI and the output (Out).

The junction J between the switching means T and the resistor R1 is also connected to ground via a separating diode D3. The output of the voltage source S1 is also connected to ground via a capacitor C1.

The means for generating control pulses comprise more particularly:

- a power supply S0 delivering a control signal S, of rectangular type and of variable frequency and duty cycle;
- a pulse generator PG triggered by the control signal S; and
- a pulse transformer for controlling the switching means T.

More particularly in the example illustrated, the switching means T is a bipolar junction transistor of the IGBT type, the gate of which is coupled to the pulse generator PG via the pulse transformer PT.

The DC voltage source S1 makes it possible, only when the transistor T is conducting, to apply a negative voltage to the magnetron cathode MC via the resistor R1 and the operating diode D1 connected in series with the cathode MC.

The aforementioned second means for generating the preionization voltage comprise a DC voltage source S2 connected to the output (Out) via a resistor R and a separating diode D in series. The voltage source S2 delivers a DC negative preionization voltage PHT as output.

A switch SW is also connected in series with the output of the voltage source S2. When the switch SW is closed, the negative preionization voltage PHT is applied to the magnetron cathode MC via the resistor R and the separating diode D.

The aforementioned switch SW is optional and is used essentially for being able to perform comparative tests (see later in the description of FIG. 4 et seq). Between:

[open switch SW]/operation of the magnetron reactor 1 in pulse mode alone (conventional operation); and

[switch SW closed]/operation according to the invention, with superposition, on the pulse mode, of a steady-state mode making it possible to obtain the required preionization of the gas (in this case, application of a negative DC preionization voltage on the magnetron cathode MC).

To produce a power supply according to the invention, the transistor T, which in the example of FIG. 2 is an IGBT transistor, may be replaced with any equivalent means known to those skilled in the art, that is to say by any rapid switching means controlled by an electrical signal. The transistor T may, for example, not exhaustively, be replaced with a Behlke switch.

Figure 3:
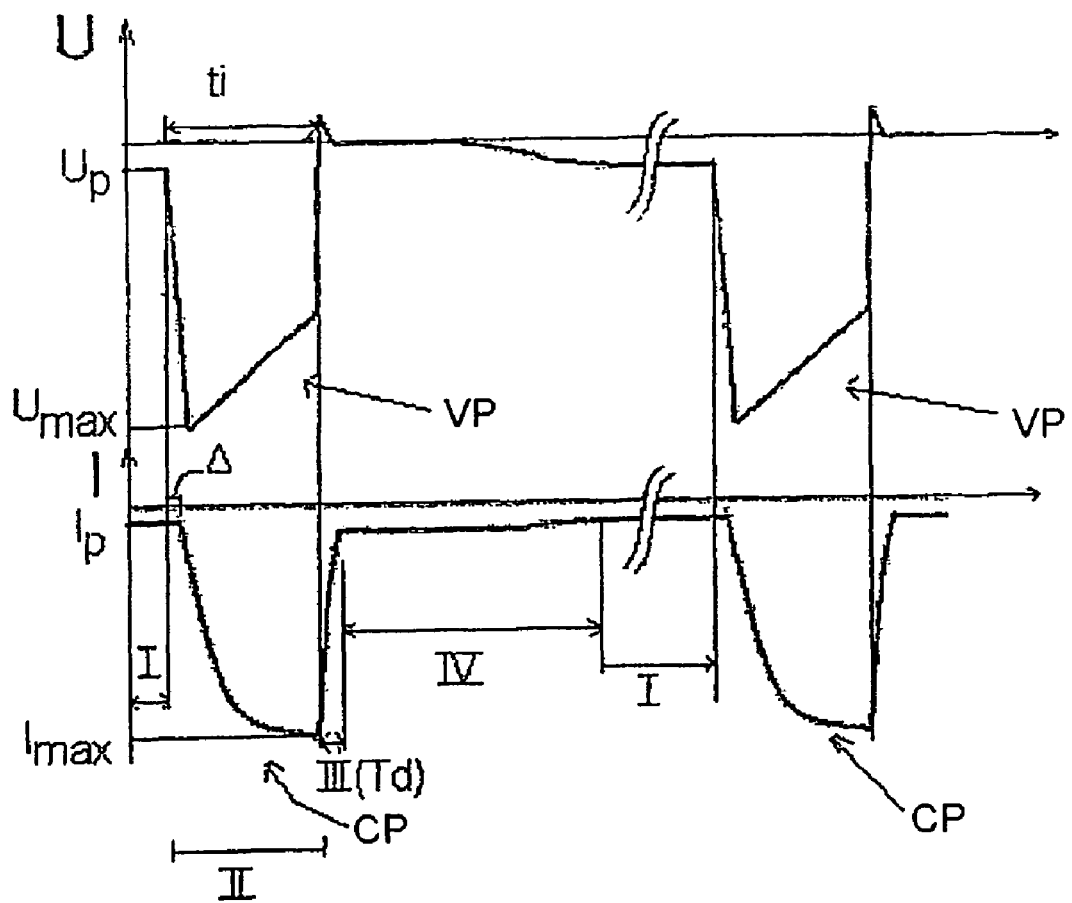
FIG. 3 shows schematically oscillograms of the voltage (U) measured on the magnetron cathode and of the current (I) through the magnetron cathode, respectively, in a single-pulse operating mode.

Operation of the Power Supply (2)/FIGS. 2 and 3

The operation of the power supply 2 will now be explained with reference to FIG. 2 and also with reference to FIG. 3. FIG. 3 shows schematically an example of an oscillogram of the voltage U measured between the magnetron cathode MC and ground and of the discharge current I passing through the magnetron cathode MC. In describing the operating phases I to IV below, it will be considered that the switch SW of the power supply 2 is closed.

Phase I/Preionization (FIG. 3):

The transistor T is in the off state. Only the negative preionization voltage PHT is applied to the magnetron cathode MC, via the current-limiting resistor R. This negative DC voltage generates continuous electrical discharge within the gas, resulting in a DC preionization current $I_P$ passing through the magnetron cathode MC, the separating diode D and the resistor R.

Phase II:

After the preionization first phase I, the gate of the transistor T is controlled by the pulse generator PG (transistor T in the On state), thereby temporarily allowing the negative voltage HT to be applied to the magnetron cathode MC via the current-limiting resistor R1 and the separating diode D1. Thus, a main voltage pulse VP, of duration $t_p$, is thus applied to the cathode MC, resulting in a main current pulse CP passing through the magnetron cathode MC. This main current pulse CP is generated with a short delay time Δ relative to the start of the voltage pulse VP.

Phase III:

The transistor T is again turned off (reverse switching of the transistor by the pulse generator PG). The high negative voltage HT is no longer applied to the magnetron cathode MC (end of the main voltage pulse). The current I is sustained only by the inductive energy accumulated in the equivalent inductor L of the magnetron reactor 1. The current I decreases with a time constant approximately equal to $L/R_E$, where $R_E$ is an equivalent series resistance the lower band of which is limited by resistance of the resistor R1. The difference between $R_E$ and R1 is due to the nonlinear impedance of the plasma. The diode D3 (FIG. 2) passes the current I after the transistor T has been switched, while at the same time preventing overvoltages on this transistor.

Phase IV:

After the pulse current has stopped, the impedance of the magnetron reactor 1 remains low owing to the high state of ionization of the magnetized plasma. Consequently, for the same DC preionization current $I_p$, the voltage U on the magnetron cathode remains low for a short time. As the state of ionization of the magnetized plasma decreases, the impedance of the magnetron reactor 1 increases with a progressive return to the initial conditions of the aforementioned preionization phase I.

The cycle is repeated with a repetition frequency f, which is fixed according to the envisaged application.

Choice of R1, C1 and R.

The choice of the resistor R1 is important for proper operation of the power supply 2. The choice is made so as to meet the following two opposed constraints:
- the decay time $T_d$ of the current pulse CP during phase III (see FIG. 3) must be as short as possible (compared with the duration $t_p$ of the main voltage pulses VP). More particularly, the resistance of R1 is chosen in such a way that the decay time $T_d$ (the current cut-off time) is less than 5 µs and preferably equal to 1 µs or less, corresponding approximately to the choice of an L/R1 ratio of less than 2.5 µs and preferably equal to 0.5 µs or less. This constraint thus makes it possible to set the minimum resistance of the resistor R1 appropriate for a given equivalent inductance L of the magnetron reactor 1 and of the connection conductors; and
- the resistance of R1 must not be too high so as to limit the maximum current $I_{max}$ (FIG. 3) generated during phase II. In practice, R1 will be chosen in such a way that this current $I_{max}$ is in all cases less than, for example, twice the maximum operating current of the magnetron reactor so as to avoid any risk of abnormal operation of the magnetron reactor.

Preferably, the power supply is regulated in such a way that one or both of the following conditions are met:
- the maximum preionization current density (at the target, that is to say the magnetron cathode) is between 0.05 mA/cm² and 100 mA/cm²;
- the maximum current density (at the target) is greater than 0.1 A/cm² and preferably greater than 1 A/cm²; and
- the current rise time is less than 20 µs and more particularly less than 1 µs.

The capacitor C1, of low series inductance, is chosen so as to obtain a pulsed current during the aforementioned phase II while still maintaining a suitable high voltage U on the magnetron cathode MC during the applied pulse.

The resistor R is chosen so as to define and limit the initial preionization current.

In an aforementioned exemplary embodiment given by way of nonlimiting indication of the invention, the voltage HT has a maximum value of −1100 V. The voltage PHT has a maximum value of −1100 V. The equivalent inductance L of the magnetron reactor 1 has a value of approximately 0.5 µH, the resistor R1 has a value of 5Ω, so that $T_d$ is about 0.1 µs, the resistor R has a value of 300 kΩ and the capacitor C1 has a value of 10 µF.

Comparative Trials: Pulsed Mode without Preionization, Pulsed Mode with Preionization (FIGS. 4 to 17)

Comparative trials were carried out with the magnetron reactor 1 and the power supply 2 described above with reference to FIGS. 1 to 3, for the purpose of demonstrating the advantageous effects of the preionization on formation of the current pulse PC during phase II, in particular on the delay time Δ of the current pulse, on its maximum intensity $I_{max}$ and on the stability of the voltage pulses VP and current pulses CP over time.

The main conditions common to all the trials were the following: the gas used to form the plasma was argon; the cathode (target) was made of titanium. The pressure inside the chamber (10) of the magnetron reactor was 10 mTorr (i.e. 1.33 Pa).

For each trial, the three signals below were simultaneously picked up by means of an oscilloscope (see FIGS. 4 to 17):
- (S): control pulse delivered by the generator S0;
- (I): current passing through the magnetron cathode (MC); and
- (U): voltage measured between the magnetron cathode (MC) and ground.

The trials were carried out each time in a comparative manner [see column (2) of the table below]:
- without applying a preionization voltage [switch SW open)/FIGS. 4, 6, 8, 10, 12, 14, 16]; and
- by applying a DC preionization voltage (PHT) [switch SW closed)/FIGS. 5, 7, 9, 11, 13, 15, 17].

For all the trials with preionization, the DC preionization voltage (PHT) was −1000 V and the DC bias current $I_b$ was about 3.3 mA. It should be noted that, owing to the magnitude of the scale used to measure the current I, the very low preionization current $I_p$ cannot be seen in the oscillograms of FIGS. 5, 7, 9, 11, 13, 15, 17.

The comparative trials were carried out in single-pulse mode (FIGS. 4 to 7 and FIGS. 12 and 13) and in double-pulse mode (FIGS. 8 to 11 and FIGS. 14 to 17), that is to say by generating successive trains of two closely-spaced voltage pulses VP.

The main variable parameters and the results of these trails are summarized in the table below. In this table, the duration $t_p$ [column 4] corresponds to the width of each main voltage pulse VP; the duration $T_p$ [column 5] corresponds, in the case of a double-pulse mode (i.e. a succession of trains of two closely-spaced voltage pulses) to the time separating the two pulses of one pulse train; the frequency f [column 6] corresponds to the repetition frequency of the voltage pulses VP (in the case of the single-pulse mode) or the repetition frequency of the trains of two closely-spaced pulses VP in the case of a double-pulse mode; the delay time Δ [column 7] measures the time separating the start of the current pulse CP from the start of the voltage pulse VP. The values of $I_{max}$ and $U_{max}$ reported in the table below [columns 8 and 9] correspond to the maximum amplitude of the current pulse and of the voltage pulse, respectively; and in the case of the trials in double-pulse mode, these amplitudes ($I_{max}$ and $U_{max}$) are measured on the first pulse of the train of two pulses.

Table/Comparative Results

| FIGURE | Pre-ionization? | Mode | Time $(t_p)$ in µs | Time $(T_p)$ in µs | Frequency (f) in Hz | Delay Time (Δ) in µs | $I_{max}$ in A | $U_{max}$ in V |
|---|---|---|---|---|---|---|---|---|
| 4 | NO | Single pulse | 10 | / | 50 | / | 10 | −1000 |
| 5 | YES | Single pulse | 10 | / | 50 | << Δ(FIG. 4) | 90 | −900 |

-continued

| FIGURE | Pre-ionization? | Mode | Time $(t_p)$ in µs | Time $(T_p)$ in µs | Frequency (f) in Hz | Delay Time ($\Delta$) in µs | $I_{max}$ in A | $U_{max}$ in V |
|---|---|---|---|---|---|---|---|---|
| 6 | NO | Single pulse | 10 | / | 100 | 3.6 | 80 | −1000 |
| 7 | YES | Single pulse | 10 | / | 100 | 1.2 | 75 | −900 |
| 8 | NO | Double pulse | 10 | 48 | 50 | / | 10 | −950 |
| 9 | YES | Double pulse | 10 | 48 | 50 | / | 90 | −1000 |
| 10(*) | NO | Double pulse | 10 | 48 | 50 | / | 20 | −1000 |
| 11(*) | YES | Double pulse | 10 | 48 | 50 | / | 90 | −1000 |
| 12 | NO | Single pulse | 5 | / | 50 | / | 30 | −1000 |
| 13 | YES | Single pulse | 5 | / | 50 | << $\Delta$(FIG. 12) | 60 | −1000 |
| 14 | NO | Double pulse | 5 | 23.8 | 100 | (**) | 0 | −1000 |
| 15 | YES | Double pulse | 5 | 23.8 | 100 | / | 60 | −1000 |
| 16(*) | NO | Double pulse | 5 | 23.8 | 100 | (**) | 0 | −1000 |
| 17(*) | YES | Double pulse | 5 | 23.8 | 100 | / | 60 | −1000 |

(*)Oscilloscope in envelope mode;
(**) No first current pulse.

Figure 4:
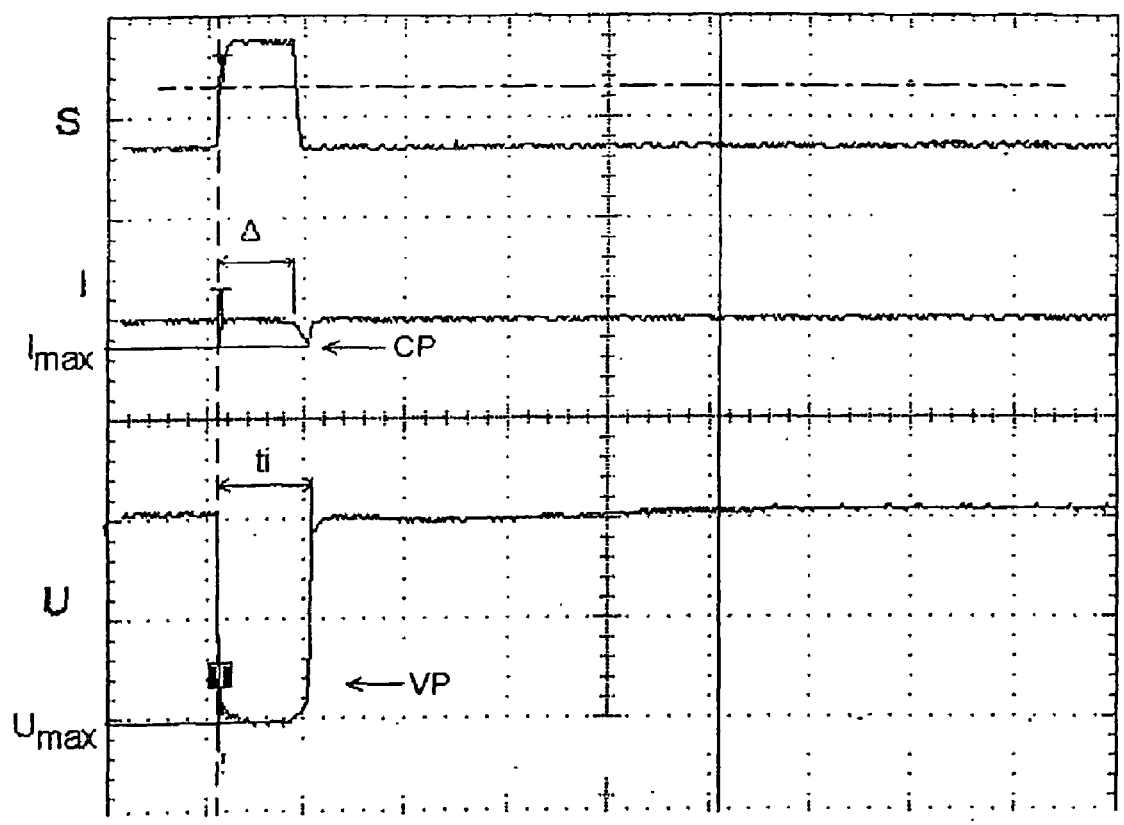
FIGS. 4 to 17 are actual oscillograms of the control signal (S) and the aforementioned voltage (U) and current (I), obtained by screen dump from an oscilloscope under various operating conditions that will be described in detail later.
Figure 5:
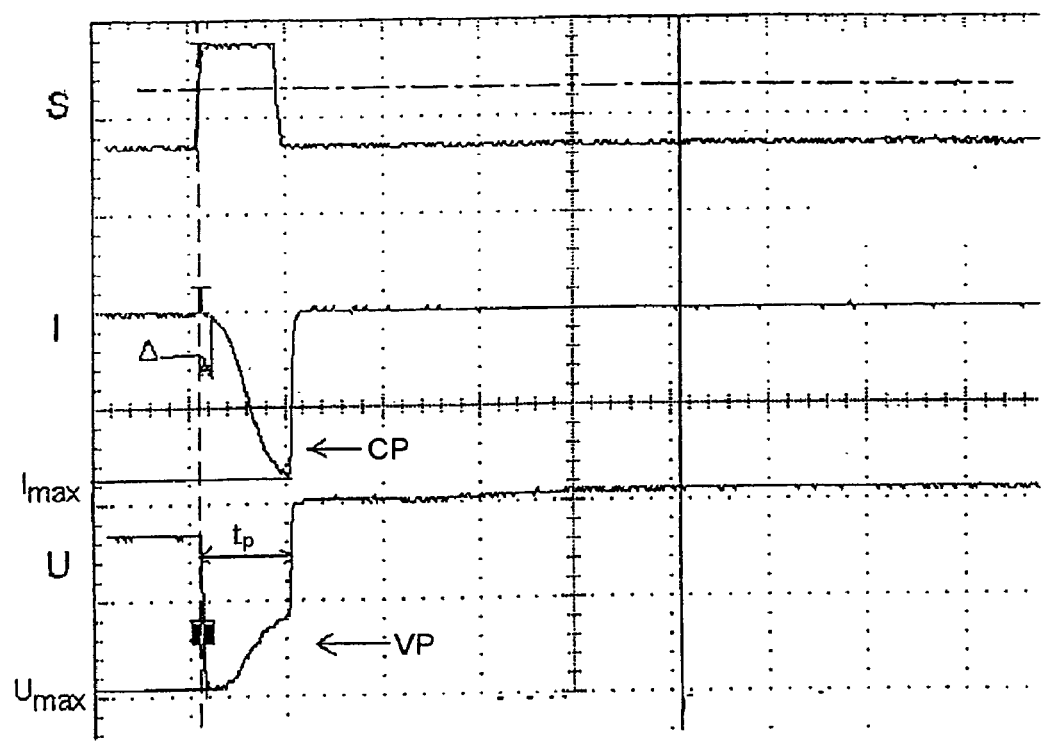

It is clearly apparent by analyzing FIGS. 4 and 5 that, in the absence of preionization (FIG. 4), the current pulse has a long delay time relative to the voltage pulse, which results in a current pulse of very low amplitude, whereas under the same operating conditions with preionization (FIG. 5), a current pulse is obtained significantly more rapidly (very short $\Delta$) and consequently with a large amplitude. The power of the electrical discharges generated within the gas is therefore, advantageously, substantially higher than in the case of operation in pulse mode with preionization. In certain cases, with no preionization, it is even possible to end up with a delay time of ($\Delta$) greater than the width of ($t_p$) of the voltage pulse, which corresponds to the almost complete absence of current pulse.

Figure 6:
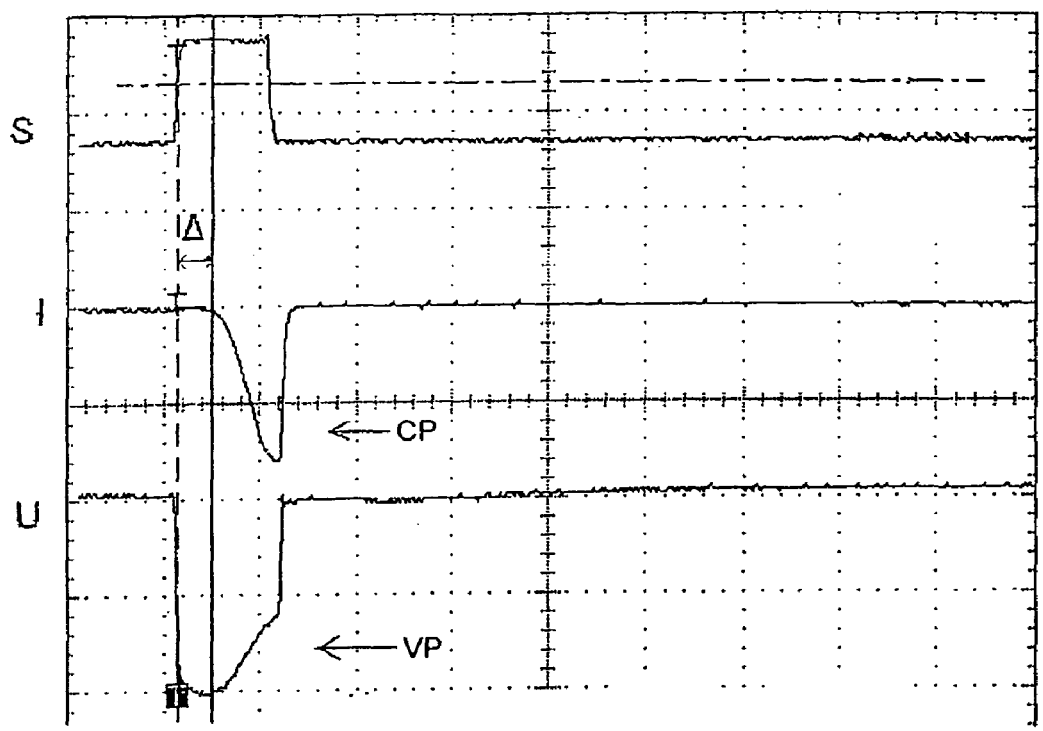
Figure 7:
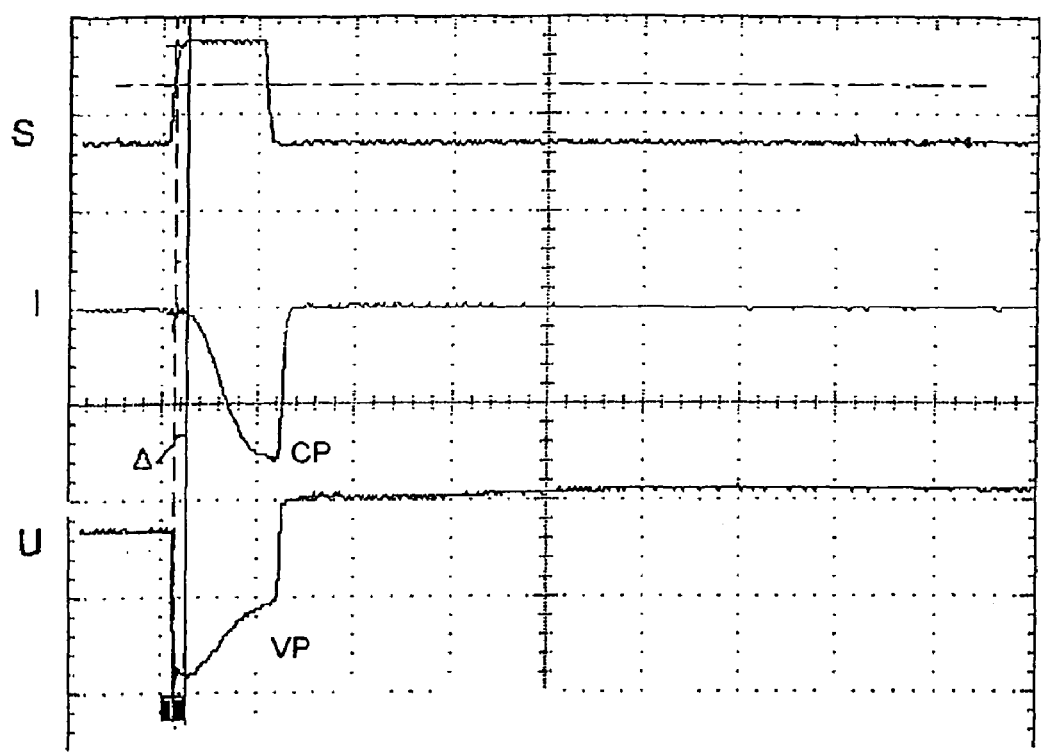

Referring to FIG. 6 (f=100 Hz), in the absence of preionization the current pulse develops more substantially than in the case of FIG. 4 (f=50 Hz), however, compared with operation at the same repetition frequency (f=50 Hz) and with preionization (FIG. 7), the current pulse occurs later (FIG. 6: $\Delta$=3.6 µs/FIG. 7: $\Delta$=1.2 µs). In the absence of preionization, the density of free charges is very low and the time needed to form the plasma of sufficient density to give rise to a useful current for the sputtering is too long. The preionization allows the magnetron current saturation phase to be reached much more quickly.

Figure 8:
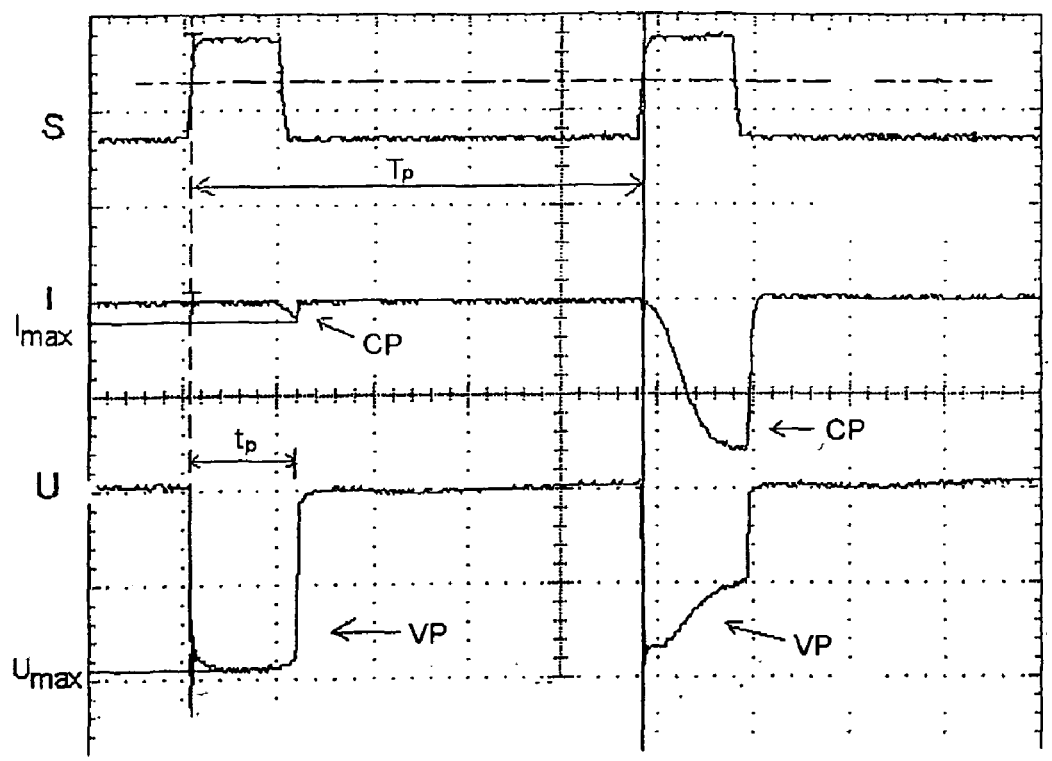
Figure 9:
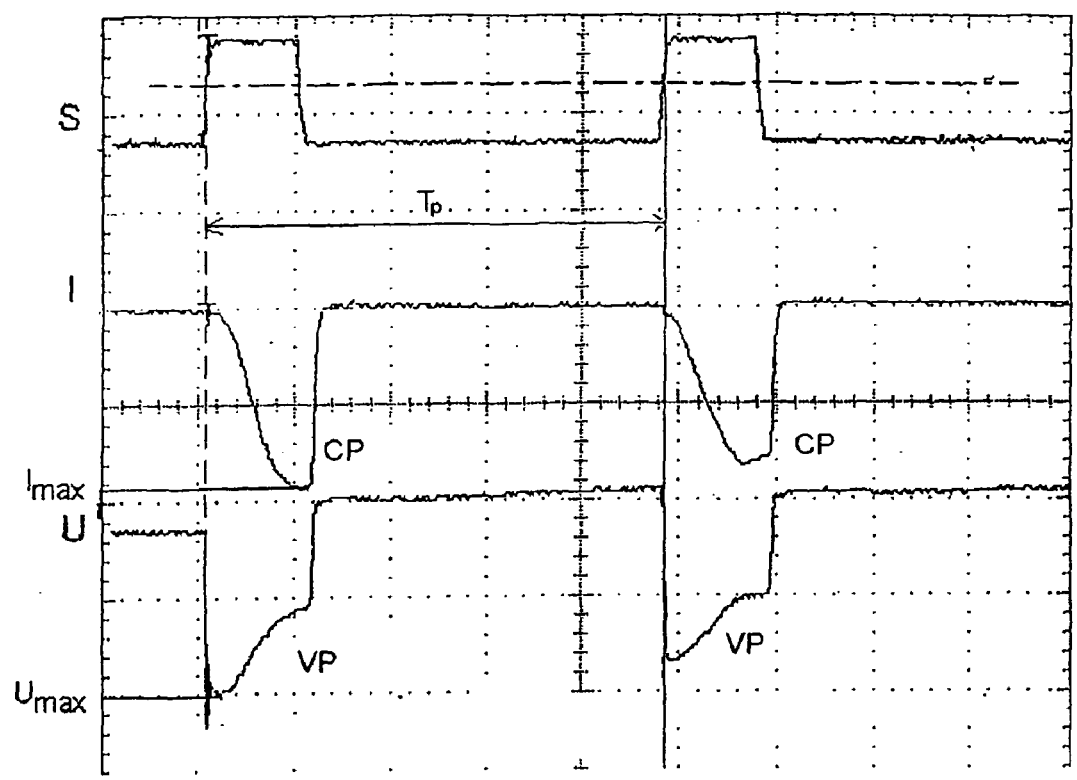
Figure 14:
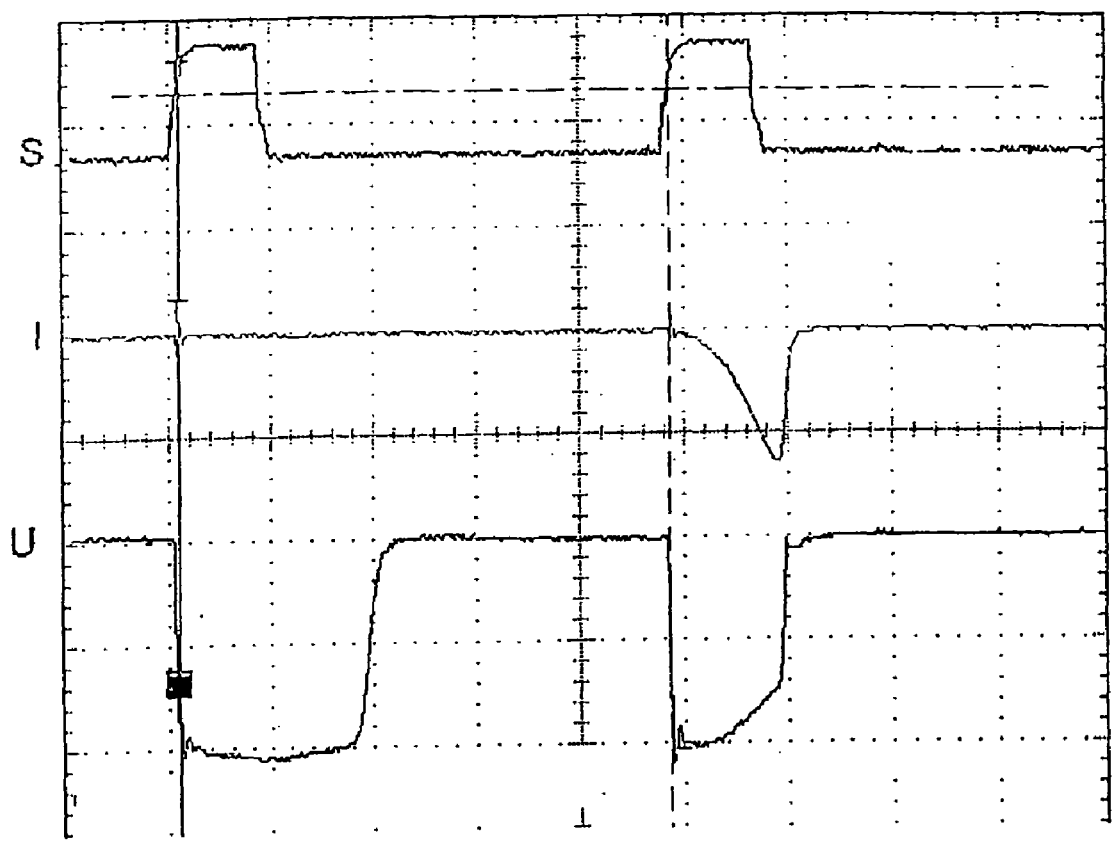
Figure 15:
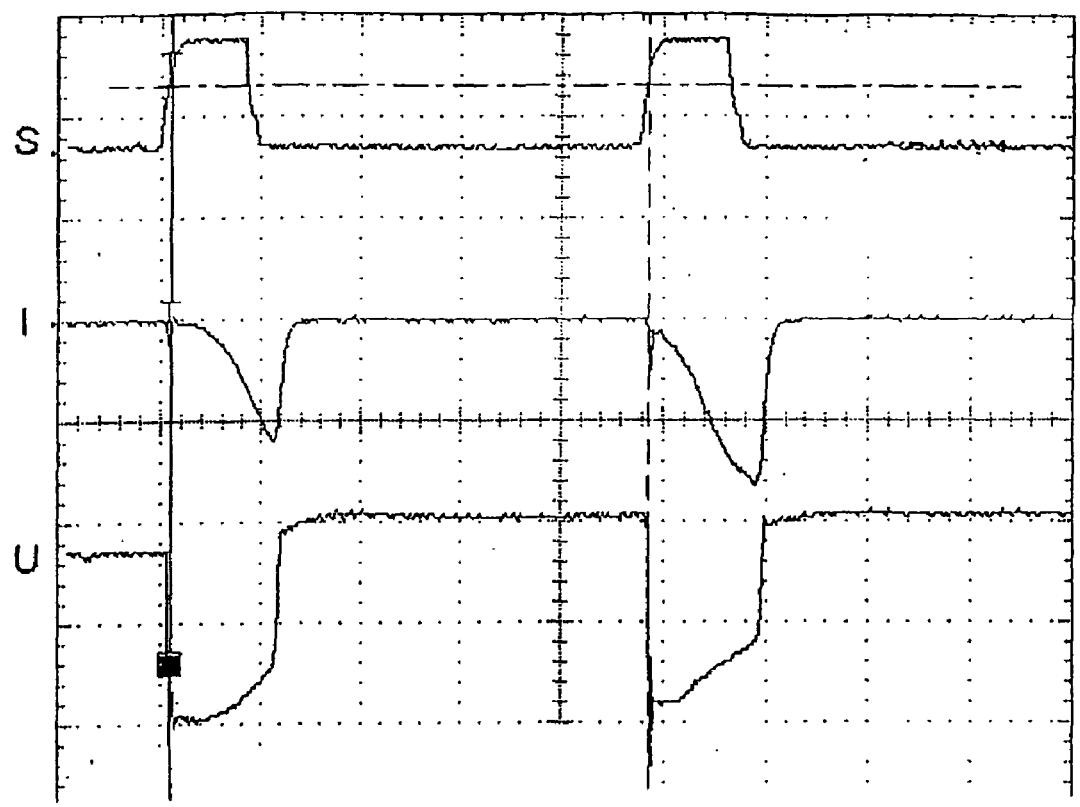

Referring to FIG. 8, in double-pulse mode without preionization, the first current pulse occurs late and consequently has a very low amplitude (a situation similar to FIG. 4 in single-pulse mode). In the case of FIG. 14 (f=100 Hz, $T_p$=23.8 µs), it may be seen that the first current pulse is completely absent when there is no preionization. In comparison, by carrying out a preionization (FIGS. 9 and 15), it may be seen that a first current pulse forms very soon and with a large amplitude. In addition, with preionization, the second current pulse advantageously has a larger amplitude than the second current pulse generated in the absence of preionization.

Figure 10:
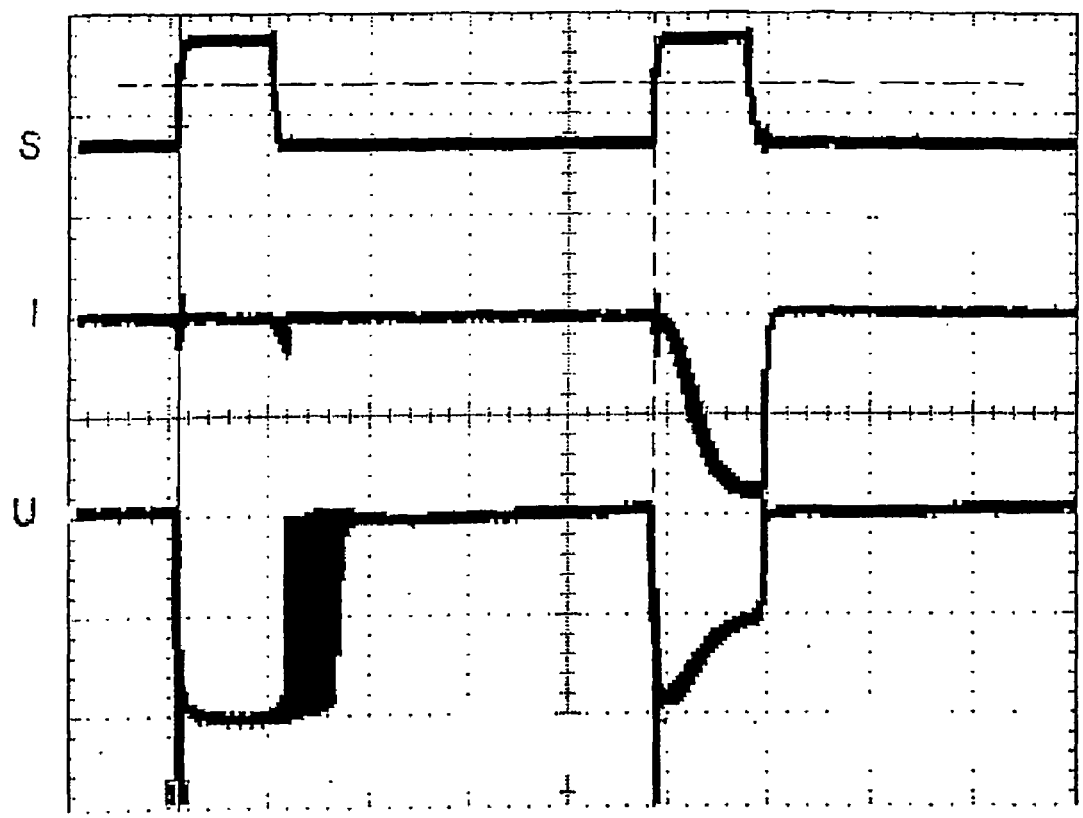
Figure 11:
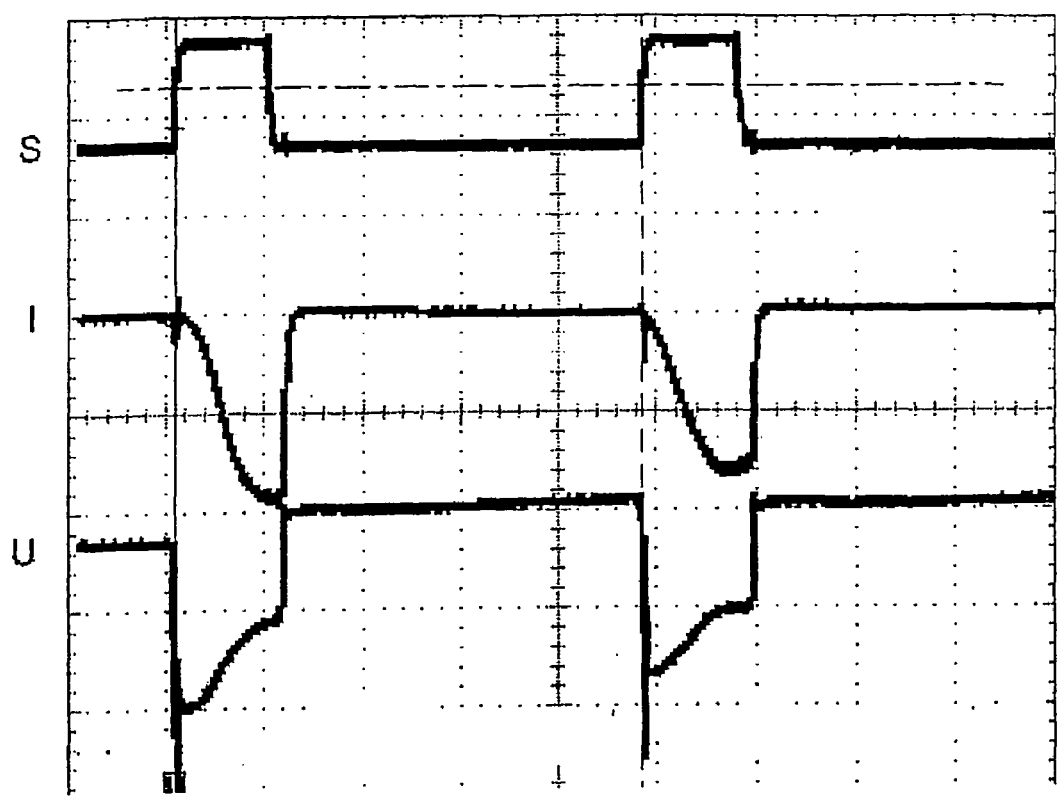
Figure 12:
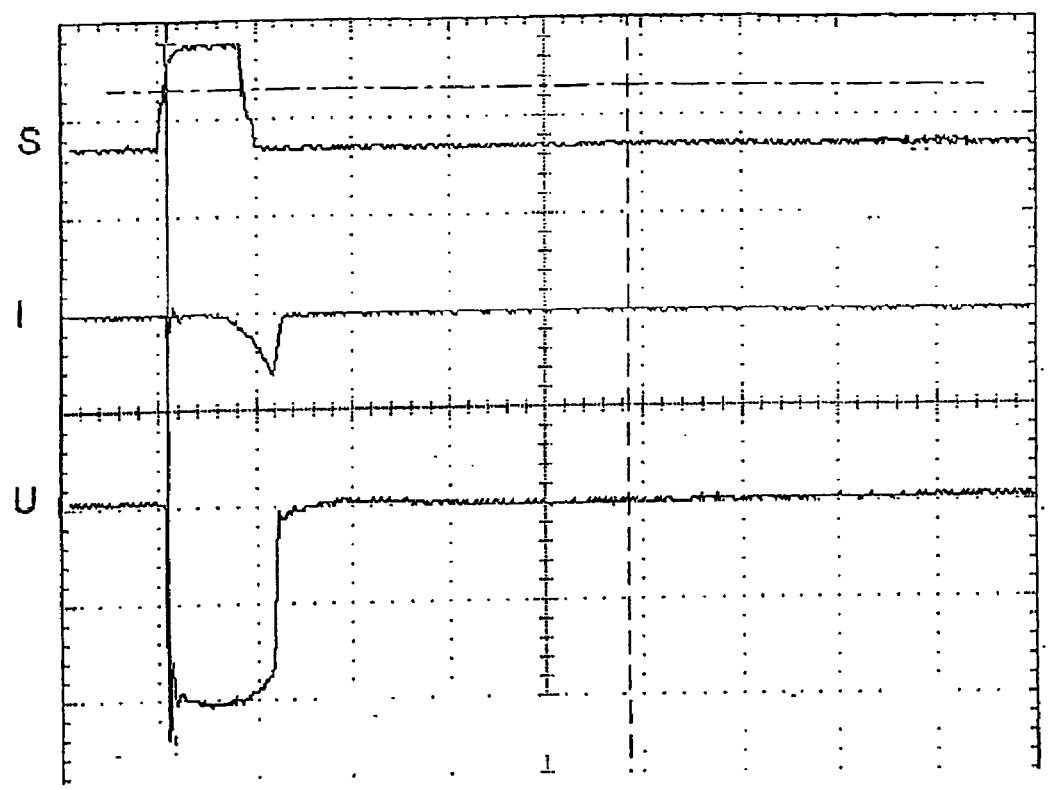
Figure 13:
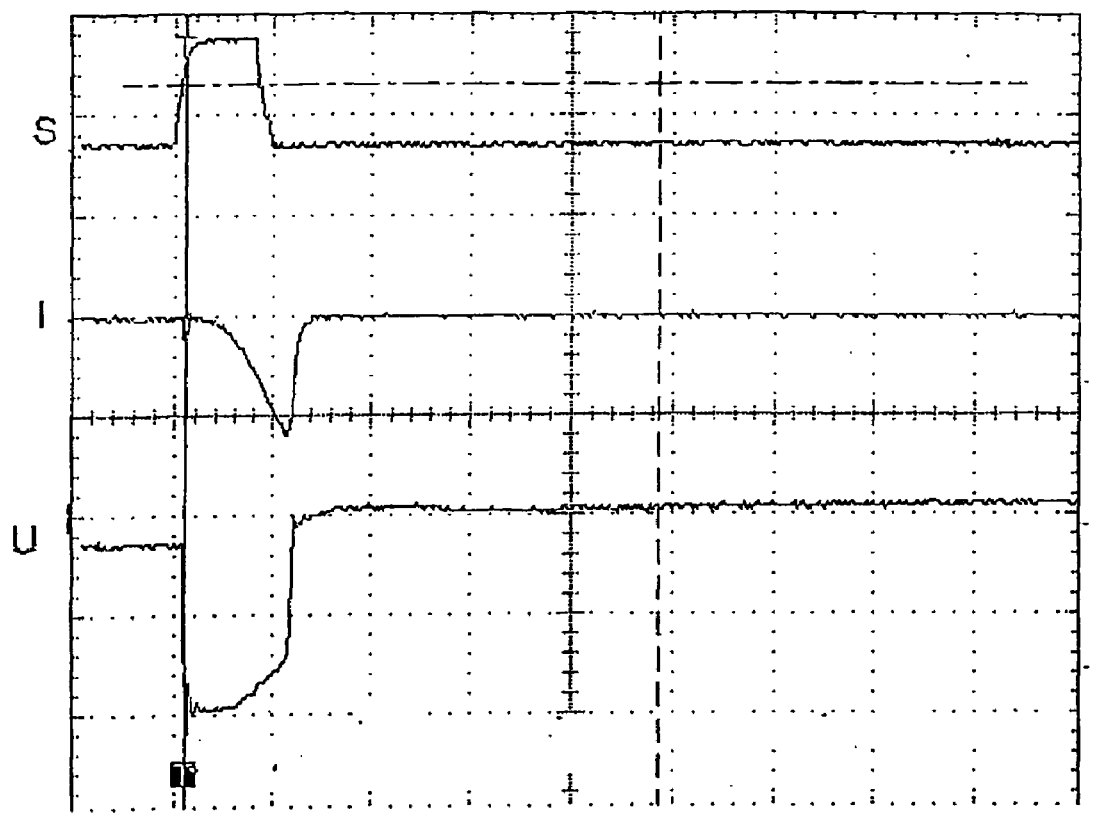
Figure 16:
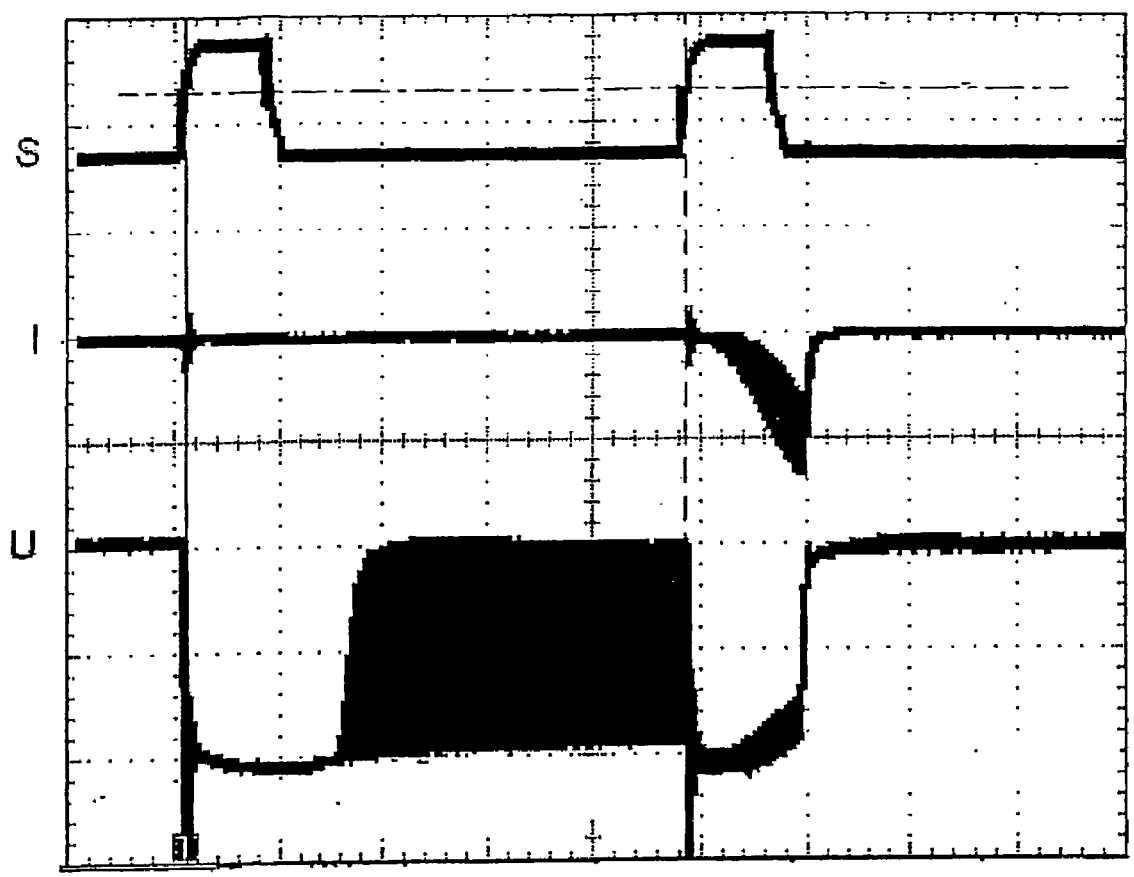
Figure 17:
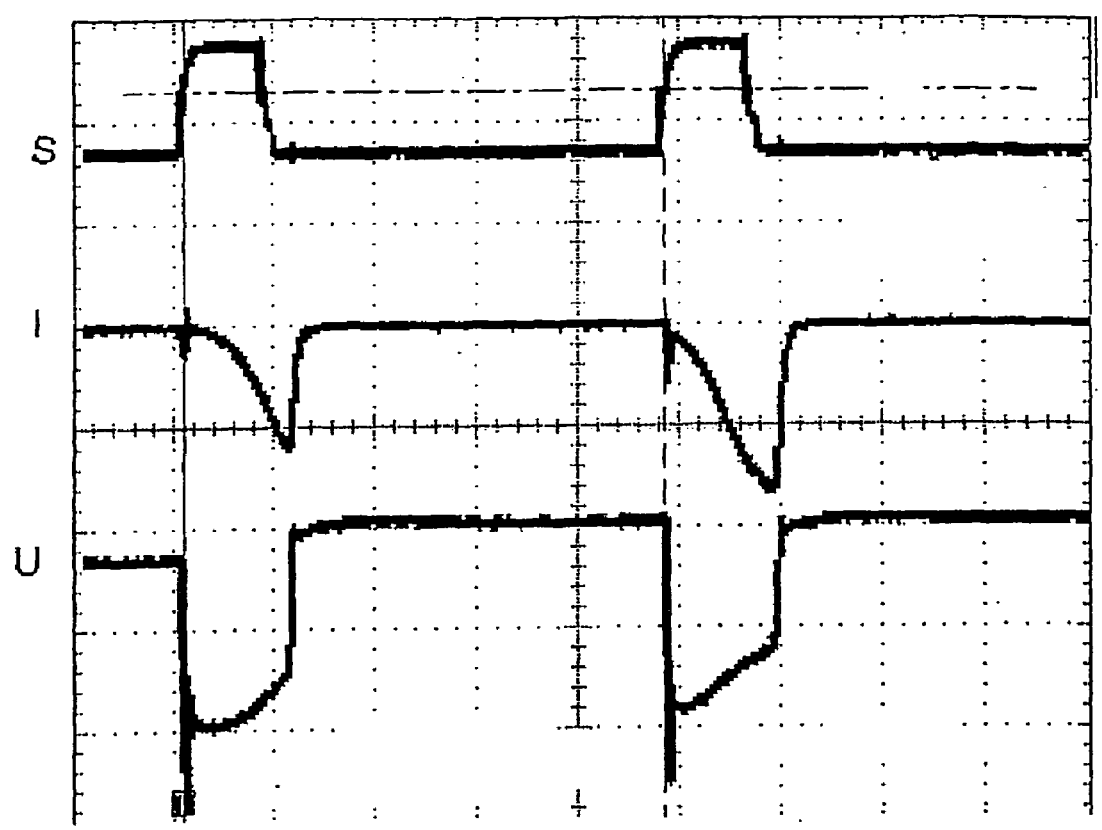

FIGS. 10 and 16 (double-pulse mode without preionization/oscilloscope in envelope mode) show very great instability over time of the current CP and voltage VP pulses, which impairs the quality and reproducibility over time of the deposition of material on the substrate. In comparison, with preionization (FIGS. 11 and 17), it should be noted that the current and voltage pulses (CP and VP) are very stable over time, thereby advantageously achieving better reproducibility and greater stability of the deposition process over time.

The invention is not limited to the aforementioned implementation examples, and especially to the electrical parameters described above for the power supply and the magnetron. It is up to a person skilled in the art to design and regulate, on a case-by-case basis, the power supply for a given magnetron, for example by observing the current I and voltage U curves by means of an oscilloscope and by modifying the preionization so as to obtain the desired effects, especially in terms of delay time and/or amplitude and/or stability of the current pulses or else so as to obtain the desired degree of ionization of the vapor arriving on the substrate. The preionization may also be adjusted so as to limit the target poisoning effects in the case of operation in a reactive gas.

More generally, the preionization of the gas prior to application of each voltage pulse VP may be achieved by any means known to those skilled in the art. More particularly, the preionization may be obtained by a sufficiently high pulse repetition frequency so as to use the residual electron density between two successive pulses.

Figure 18:
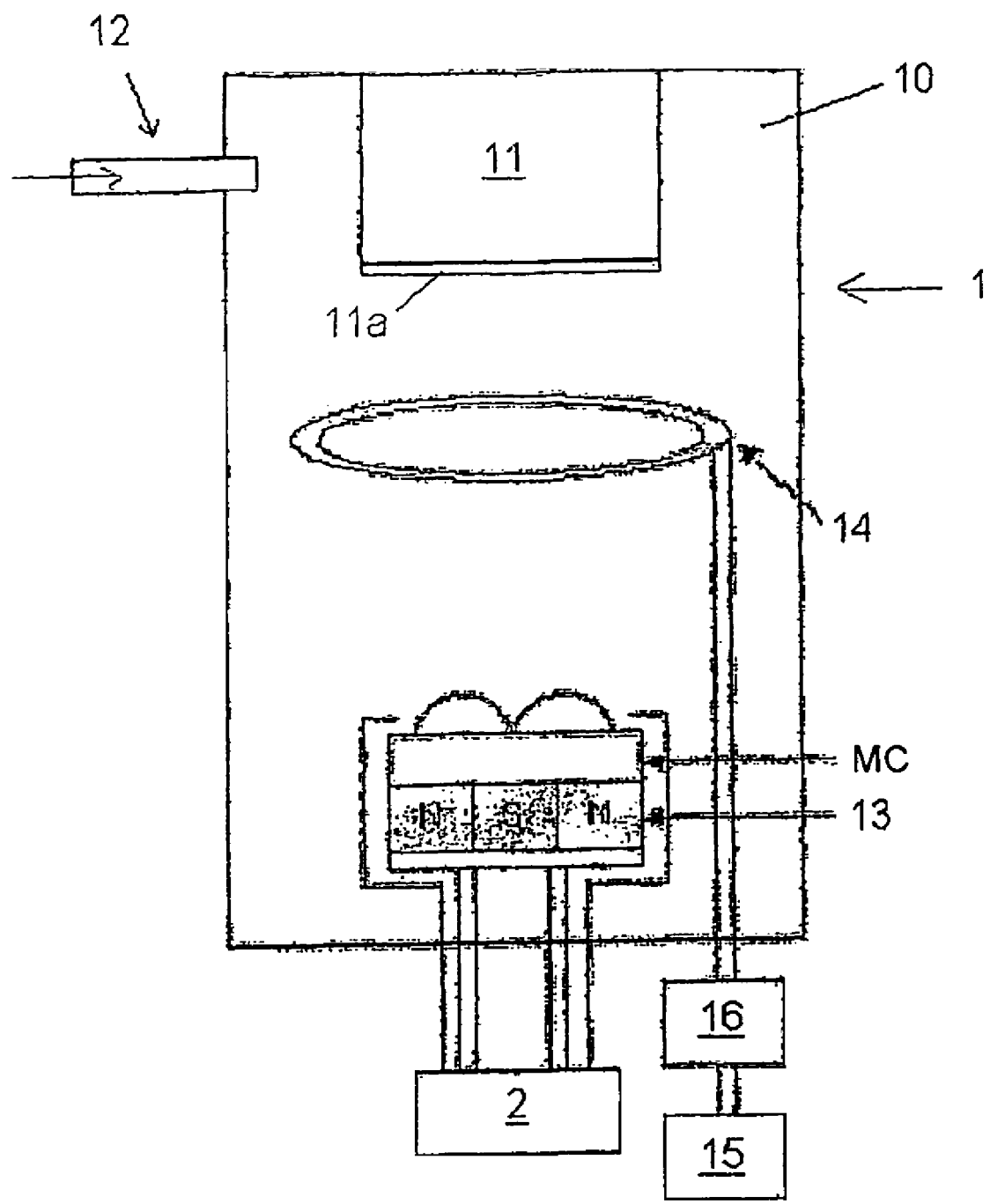
FIG. 18 shows schematically another embodiment of a magnetron reactor of the invention, with an RF loop for the preionization.

By way of nonlimiting example, the preionization may also be obtained by creating a plasma, by RF excitation or secondary microwaves or by any other means for obtaining a sufficient preionization electron density (corona discharge, UV preionization) in addition to the main pulse plasma. For example, with reference to the embodiment illustrated in FIG. 18, the gas undergoes an RF excitation by means of a copper loop 14 placed inside the deposition chamber near the magnetron cathode and supplied by a generator 15 with an RF current of predefined frequency. In FIG. 18, the block 16 shows schematically an impedance matching circuit interposed in a manner known per se between the generator 15 and the loop 14.

Results similar to those described above may be obtained with an RF excitation at a frequency of 13.56 MHz, the distance between the magnetron cathode CM and the copper loop 14 being about 4 cm. The coupling of the RF excitation is not necessarily of the inductive type—it may also be of the capacitive type.

In another embodiment (not shown), the preionization may also be obtained by means of microwaves applied in the deposition chamber, for example at a frequency of 2.45 GHz.

In the examples of FIGS. 1 to 17, the preionization was obtained by means of a DC preionization current. This does not limit the invention. In another embodiment, the preionization current could be a pulsed current, the essential point being that the preionization of the gas precedes application of the voltage pulse. In this case, the preionization current pulses must precede the main voltage pulses VP. This comment is also valid in the case of RF or microwave excitation or any other preionization excitation, it being possible for such excitations to be carried out equally well in DC mode or in pulsed mode.

The invention claimed is:

1. A process for depositing, in a magnetron reactor (1) equipped with a magnetron cathode (MC), at least one material on a substrate, according to which process said material is vaporized, by magnetron sputtering, using a gas that is ionized in pulsed mode by applying main voltage pulses (VP) to the magnetron cathode (MC), characterized in that, prior to each main voltage pulse (VP), wherein the gas is preionized so as to generate a current pulse (CP) having a decay time ($T_d$), after cut-off of the main voltage pulses (VP), wherein the decay time is reduced by discharging a residual current of the current pulse through a resistor, R1, to ground, and wherein R1 is connected in series with the magnetron cathode (MC), the decay time determined by an equivalent inductance, L, of the magnetron reactor, wherein R1 is chosen such that L/R1 is shorter than 2.5 μs.

2. The process as claimed in claim 1, characterized in that the decay time ($T_d$) of a current pulse (CP), after cut-off of the main voltage pulse (VP), is shorter than 1 μs.

3. The process as claimed in claim 1, characterized in that the degree of vapor ionization measured near the substrate is greater than 10% and preferably greater than 70%.

4. The process as claimed in claim 1, characterized in that the gas is preionized by applying a preionization voltage to the magnetron cathode (MC).

5. The process as claimed in claim 4, characterized in that the preionization voltage is a DC voltage.

6. The process as claimed claim 1, characterized in that the preionization current density at the magnetron cathode is between 0.05 mA/cm$^2$ and 100 mA/cm$^2$.

7. The process as claimed in claim 1, characterized in that the preionization is ensured by a pulse repetition frequency high enough to form a stable current pulse at each voltage pulse.

8. The process as claimed in claim 1, characterized in that the gas is preionized by RF excitation of the gas.

9. The process as claimed in claim 1, characterized in that the gas is preionized by microwave excitation of the gas.

10. The process as claimed in claim 1, characterized in that the main voltage pulses are generated by successive trains of at least two closely-spaced pulses (VP).

11. The process as claimed in claim 1, characterized in that the duration ($t_p$) of the main voltage pulses (VP) is shorter than 50 μs, more particularly shorter than 20 μs and preferably between 1 μS and 10 μs.

12. The process as claimed in claim 1, characterized in that the frequency (f) of the pulses (in single-pulse mode) or of the closely-spaced pulse trains does not exceed 100 kHz and is preferably greater than 50 Hz.

13. The process of claim 1, further comprising:
supplying pulsed power for the magnetron reactor via a power supply comprising; an output configured to be connected to the cathode of the magnetron reactor; a first device for generating main voltage pulses on the output; a second device for generating a preionization voltage on the output simultaneously with the main voltage pulses; wherein the first device for generating the main voltage pulses comprises a DC voltage source; a control pulse generating device; a switching device, which is mounted between the DC voltage source and the output, and which is controlled by the control pulse generating device; and a resistor connected in series between the switching device and the output, wherein a junction between the switching device and the resistor is grounded.

14. The process of claim 13, wherein the resistor, R1, is chosen in such a way that L/R1 is less than 0.5 μs.

15. The process of claim 13, wherein supplying pulsed power for the magnetron reactor comprises providing a diode between the junction and ground, allowing a discharge current to pass between the output and ground, protecting the switching device from an overvoltage.

16. The process of claim 13, wherein the second device for generating a preionization voltage comprises a DC voltage source connected to the output via a resistor and a separating diode connected in series.

17. The process of claim 13, wherein the output of the power supply is connected to the cathode of the magnetron reactor.

* * * * *